(12) United States Patent
Watanabe

(10) Patent No.: US 9,362,368 B2
(45) Date of Patent: Jun. 7, 2016

(54) SUBSTRATE WITH SILICON CARBIDE FILM, METHOD FOR PRODUCING SUBSTRATE WITH SILICON CARBIDE FILM, AND SEMICONDUCTOR DEVICE

(71) Applicant: SEIKO EPSON CORPORATION, Tokyo (JP)

(72) Inventor: Yukimune Watanabe, Hokuto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/926,914

(22) Filed: Oct. 29, 2015

(65) Prior Publication Data

US 2016/0126321 A1 May 5, 2016

(30) Foreign Application Priority Data

Oct. 31, 2014 (JP) .................................. 2014-223558
Jul. 27, 2015 (JP) .................................. 2015-147473

(51) Int. Cl.
*H01L 29/16* (2006.01)
*H01L 29/04* (2006.01)
*H01L 21/02* (2006.01)
*H01L 21/00* (2006.01)

(52) U.S. Cl.
CPC ........ *H01L 29/1608* (2013.01); *H01L 21/0262* (2013.01); *H01L 21/02381* (2013.01); *H01L 21/02433* (2013.01); *H01L 21/02488* (2013.01); *H01L 21/02529* (2013.01); *H01L 21/02587* (2013.01); *H01L 29/04* (2013.01); *H01L 29/045* (2013.01)

(58) Field of Classification Search
None
See application file for complete search history.

(56) References Cited

U.S. PATENT DOCUMENTS

| 5,296,086 | A | 3/1994 | Takasu | |
| 2010/0164059 | A1* | 7/2010 | Suzuki | H01L 21/76816 257/531 |
| 2012/0235163 | A1 | 9/2012 | Watanabe | |
| 2013/0049013 | A1* | 2/2013 | Shimada | H01L 21/0237 257/77 |
| 2013/0181230 | A1* | 7/2013 | Watanabe | H01L 21/02378 257/77 |
| 2015/0287789 | A1* | 10/2015 | Fujiwara | H01L 29/66666 257/77 |

FOREIGN PATENT DOCUMENTS

| JP | H05-29217 A | 2/1993 |
| JP | H11-181567 A | 7/1999 |
| JP | 2012-195493 A | 10/2012 |
| JP | 2013-035731 A | 2/2013 |
| JP | 2013-149733 A | 8/2013 |

\* cited by examiner

*Primary Examiner* — Evren Seven
(74) *Attorney, Agent, or Firm* — Oliff PLC

(57) ABSTRACT

A substrate with a silicon carbide film includes a Si substrate, and a SiC film and a mask stacked on the Si substrate. The SiC film has a first SiC film provided on the upper side of the Si substrate and a second SiC film provided on the upper side of the first SiC film. The mask has a first mask provided on the Si substrate and including an opening (first opening) and a second mask provided on the first SiC film and including an opening (second opening). The width W1 (μm) of the first opening and the thickness T1 (μm) of the first mask satisfy the following relationship: $T1 < \tan(54.6°) \times W1$.

19 Claims, 6 Drawing Sheets

SUBSTRATE WITH SILICON CARBIDE FILM, METHOD FOR PRODUCING SUBSTRATE WITH SILICON CARBIDE FILM, AND SEMICONDUCTOR DEVICE

This application claims a priority to Japanese Patent Application No. 2014-223558 filed on Oct. 31, 2014 and Japanese Patent Applications No. 2015-147473 filed on Jul. 27, 2015 which are hereby expressly incorporated by reference in its entirety.

BACKGROUND

1. Technical Field

The present invention relates to a substrate with a silicon carbide film, a method for producing a substrate with a silicon carbide film, and a semiconductor device.

2. Related Art

Silicon carbide (SiC) is a wide band gap semiconductor having a band gap (2.36 to 3.23 eV) two or more times wider than that of silicon (Si), and has attracted attention as a material for a high withstand voltage device recently.

However, since the crystal formation temperature of SiC is high unlike Si, it is difficult to form a single crystal ingot by a pulling method from a liquid phase in the same manner as a Si substrate. Therefore, a method in which a single crystal ingot of SiC is formed by sublimation has been proposed. However, it is very difficult to form a substrate having a large diameter and few crystal defects by sublimation. On the other hand, among SiC crystals, cubic SiC (3C-SiC) can be formed at a relatively low temperature, and therefore, a method in which cubic SiC is epitaxially grown directly on a Si substrate has been proposed.

As one method for producing a SiC substrate using this epitaxial growth, a heteroepitaxial technique in which 3C-SiC is stacked on a Si substrate in a gas phase has been studied. However, the lattice constants of Si and 3C-SiC are 5.43 Å and 4.36 Å, respectively, and there is an about 20% difference. Further, the thermal expansion coefficient of Si is $2.55 \times 10^{-6}$ $K^{-1}$, and the thermal expansion coefficient of 3C-SiC is $2.77 \times 10^{-6}$ $K^{-1}$, and there is an about 8% difference. Therefore, it is very difficult to obtain a high-quality epitaxial film (3C-SiC film) with few crystal defects from these materials. Further, these differences in the lattice constant and the thermal expansion coefficient result in generating large stress in the 3C-SiC film, and as a result, a problem of warpage of a wafer also occurs.

The crystal defects as described above are mainly so-called twin defects and anti-phase boundary (APB) defects. As a method for reducing these crystal defects, for example, in JP-A-11-181567 discloses a method for effectively reducing crystal defects by forming an oxide film or the like on a growth base substrate, providing an epitaxial growth region using this oxide film or the like as a mask, and setting the thickness T of the oxide film or the like with respect to the width W1 of an opening of the growth region to tan (54.6°)×W1 (tan (54.6°) times) or more. In this case, assuming that the width W1 of the opening is set to, for example, about 0.5 μm, the oxide film or the like to be used as the mask needs to have a thickness T of 0.7 μm or more.

By using a currently available process technique, the difficulty level of a pattern forming process is not so high, however, it is necessary to form a patterned oxide film or the like with high accuracy at a relatively high aspect ratio. Further, the thickness of the oxide film or the like is relatively large, and therefore, a problem that the SiC substrate is warped or the like due to film stress generated in the oxide film or the like occurs.

SUMMARY

An advantage of some aspects of the invention is to solve at least one of the problems or issues described above, and the invention can be implemented as the following application examples or embodiments.

Application Example 1

A substrate with a silicon carbide film according to this application example of the invention includes a silicon substrate, and a cubic silicon carbide film and a mask stacked on the silicon substrate, wherein the cubic silicon carbide film has a first cubic silicon carbide film provided on the upper side of the silicon substrate and a second cubic silicon carbide film provided on the upper side of the first cubic silicon carbide film, the mask has a first mask provided between the silicon substrate and the first cubic silicon carbide film and a second mask provided between the first cubic silicon carbide film and the second cubic silicon carbide film, the first mask includes a first opening, and the silicon substrate is exposed from the first opening, the second mask includes a second opening, and the first cubic silicon carbide film is exposed from the second opening, and when the width of the first opening is represented by W1 (μm) and the thickness of the first mask is represented by T1 (μm), the following relationship is satisfied: $T1 < \tan(54.6°) \times W1$.

According to this configuration, a crystal defect occurring due to a difference in the lattice constant or the like between silicon and silicon carbide can be blocked by the mask, and thus, a substrate with a higher-quality silicon carbide film can be provided.

Application Example 2

In the substrate with a silicon carbide film according to the application example of the invention, it is preferred that the first mask and the second mask are placed at positions where they overlap each other in plan view.

According to this configuration, the first mask and the second mask are placed at positions where they overlap each other in plan view, and therefore, a crystal defect can be more accurately blocked.

Application Example 3

In the substrate with a silicon carbide film according to the application example of the invention, it is preferred that the width of the second opening is the same as or smaller than the width of the first opening.

According to this configuration, the width of the second opening is the same as or smaller than the width of the first opening, whereby a crystal defect can be more accurately blocked.

Application Example 4

In the substrate with a silicon carbide film according to the application example of the invention, it is preferred that when the distance from the bottom surface of the first mask to the bottom surface of the second mask is represented by D1 (μm), the following relationship is satisfied: $D1 \geq \tan(54.6°) \times W1$.

According to this configuration, the distance between the first mask and the second mask can be maintained at an appropriate value, and therefore, a crystal defect can be more accurately blocked.

Application Example 5

In the substrate with a silicon carbide film according to the application example of the invention, it is preferred that the surface of the silicon substrate on which the first cubic silicon carbide film is formed has a plane orientation of (100).

According to this configuration, when the surface of the silicon substrate on which the first cubic silicon carbide film is formed has a plane orientation of (100), a crystal defect occurring in the first cubic silicon carbide film can be grown along the plane orientation of (111), and thus, this crystal defect can be blocked by the second mask. Therefore, a substrate with a higher-quality silicon carbide film can be formed.

Application Example 6

In the substrate with a silicon carbide film according to the application example of the invention, it is preferred that the cubic silicon carbide film further has a third cubic silicon carbide film provided on the upper side of the second cubic silicon carbide film, and the mask further has a third mask provided between the second cubic silicon carbide film and the third cubic silicon carbide film, and the third mask includes a third opening, and the second cubic silicon carbide film is exposed from the third opening.

According to this configuration, a substrate with a higher-quality silicon carbide film can be formed.

Application Example 7

In the substrate with a silicon carbide film according to the application example of the invention, it is preferred that the first mask is provided on and in contact with the silicon substrate.

According to this configuration, a silicon carbide film is not provided between the first mask and the silicon substrate, and the epitaxial growth starts at the silicon substrate in the first opening. Due to this, also the occurrence of a crystal defect can be made to start at the first opening, and therefore, the position of the crystal defect to occur can be more easily specified, and thus, the crystal defect can be more easily blocked.

Application Example 8

A method for producing a substrate with a silicon carbide film according to this application example of the invention includes: a first step of forming a first film on a silicon substrate; a second step of forming a first opening for exposing the silicon substrate in the first film; a third step of forming a first cubic silicon carbide film to a predetermined thickness on the silicon substrate exposed in the first opening by epitaxial growth; a fourth step of forming a second film on the first cubic silicon carbide film; a fifth step of forming a second opening for exposing the first cubic silicon carbide film in the second film; and a sixth step of forming a second cubic silicon carbide film on the first cubic silicon carbide film exposed in the second opening by epitaxial growth, wherein when the thickness of the first film is represented by T1 and the width of the first opening is represented by W1, the following relationship is satisfied: $T1 < \tan(54.6°) \times W1$.

According to this method, a cubic silicon carbide film in which the second cubic silicon carbide film has fewer crystal defects than the first cubic silicon carbide film can be formed.

Application Example 9

In the method for producing a substrate with a silicon carbide film according to the application example of the invention, it is preferred that in the third step, when the predetermined thickness is represented by D1, the following relationship is satisfied: $D1 \geq \tan(54.6°) \times W1$.

According to this method, a crystal defect occurring in the first cubic silicon carbide film can be more accurately blocked.

Application Example 10

In the method for producing a substrate with a silicon carbide film according to the application example of the invention, it is preferred that the upper surface of the silicon substrate has a plane orientation of (100).

According to this method, a crystal defect in the first cubic silicon carbide film can be made to occur along the plane orientation of (111).

Application Example 11

In the method for producing a substrate with a silicon carbide film according to the application example of the invention, it is preferred that the width of the second opening is the same as or smaller than the width of the first opening, and the first opening and the second opening are placed at positions where they overlap each other when the silicon substrate is seen in plan view.

According to this method, a crystal defect in the first cubic silicon carbide film can be more accurately blocked.

Application Example 12

In the method for producing a substrate with a silicon carbide film according to the application example of the invention, it is preferred that the method further includes: a seventh step of forming a third film on the second cubic silicon carbide film; an eighth step of forming a third opening for exposing the second cubic silicon carbide film in the third film; and a ninth step of forming a third cubic silicon carbide film on the second cubic silicon carbide film exposed from the third opening by epitaxial growth.

According to this method, as the third cubic silicon carbide film, a cubic silicon carbide film having fewer crystal defects can be formed.

Application Example 13

A semiconductor device according to this application example of the invention is produced by using the substrate with a silicon carbide film according to the aspect of the invention.

According to this configuration, the cubic silicon carbide film has a relatively high withstand voltage, and therefore, by using the substrate with a silicon carbide film according to the application example of the invention, a semiconductor device to be used for application of a relatively high voltage can be produced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
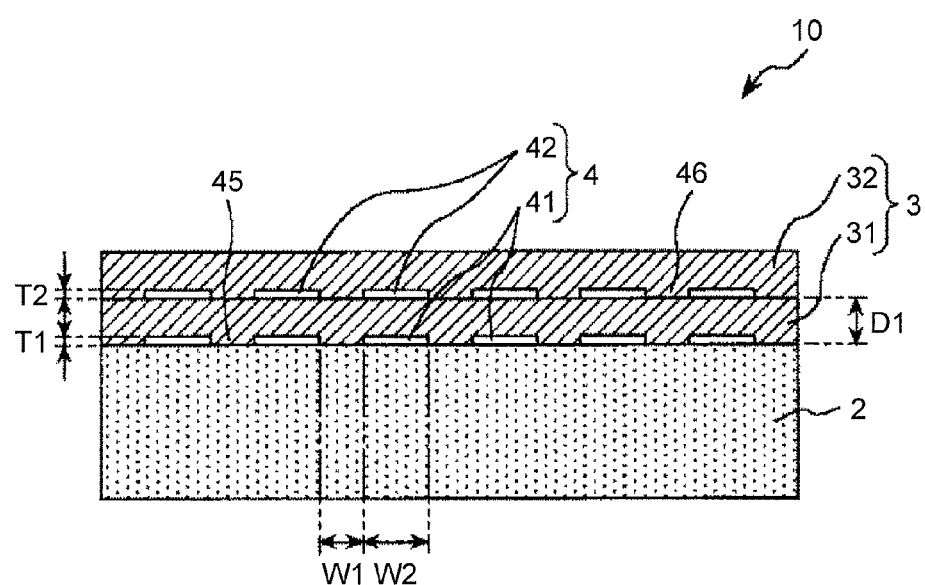
FIG. 1 is a longitudinal cross-sectional view showing a first embodiment of a substrate with a silicon carbide film according to the invention.

Hereinafter, a substrate with a silicon carbide film, a method for producing a substrate with a silicon carbide film, and a semiconductor device according to the invention will be described in detail based on preferred embodiments shown in the accompanying drawings. Incidentally, the drawings to be used are for reference only to facilitate the description, and the sizes, ratios, and the like of the respective components shown in the drawings are not necessarily the same.

Substrate with Silicon Carbide Film

First Embodiment

First, a first embodiment of a substrate with a silicon carbide film according to the invention will be described.

FIG. 1 is a longitudinal cross-sectional view showing a first embodiment of a substrate with a silicon carbide film according to the invention, and is a view seen from the direction perpendicular to the (011) plane of a Si substrate. In the following description, the upper side of FIG. 1 is referred to as "upper", and the lower side of FIG. 1 is referred to as "lower".

As shown in FIG. 1, a substrate with a silicon carbide film (a substrate with a cubic silicon carbide film) 10 has a Si substrate (silicon substrate) 2, a 3C-SiC (cubic silicon carbide) film (hereinafter sometimes simply referred to as "SiC film") 3 stacked on the Si substrate 2, and a mask 4 used when this SiC film 3 is formed.

In this embodiment, the SiC film 3 has a first SiC film 31 provided on the upper side of the Si substrate 2 and a second SiC film 32 provided on the upper side of the first SiC film 31. The mask 4 has a first mask 41 provided on the Si substrate 2 and including an opening (first opening) 45 and a second mask 42 provided on the first SiC film 31 and including an opening (second opening) 46.

The Si substrate 2 supports the SiC film 3 and also is used as a growth base substrate for forming the SiC film 3 by a heteroepitaxial technique.

The Si substrate 2 is formed by, for example, slicing a silicon single crystal ingot pulled by a CZ method (Czochralski method), followed by polishing. The upper surface of the Si substrate 2 has a plane orientation of (100). The upper surface of the Si substrate 2 may be an offset substrate in which a crystal axis is inclined by several degrees.

In this embodiment, as shown in FIG. 1, as the Si substrate 2, a silicon single crystal substrate is used, however, the Si substrate is not limited thereto, and may be, for example, a substrate having a single crystal silicon film formed on a substrate made of quartz, sapphire, or stainless steel, or the like. The lattice constant of the Si substrate 2 in this embodiment is 0.543 nm.

In this embodiment, the SiC film 3 has a first SiC film 31 provided on the upper side of the Si substrate 2 and a second SiC film 32 provided on the upper side of the first SiC film 31.

The first SiC film 31 and the second SiC film 32 constituting the SiC film 3 are each a semiconductor film formed by epitaxially growing cubic silicon carbide (3C-SiC). Cubic silicon carbide has a wide band gap of 2.36 eV or more and has a high thermal conductivity and a high breakdown field, and therefore is preferably used as a wide band gap semiconductor for power devices. The lattice constant of the SiC film 3 (the first SiC film 31 and the second SiC film 32) composed of such cubic silicon carbide is 0.436 nm.

The mask 4 has a first mask 41 provided on the Si substrate 2 and including an opening 45 and a second mask 42 provided on the first SiC film 31 and including an opening 46. The first mask 41 and the second mask 42 are used for forming the first SiC film 31 and the second SiC film 32, respectively, and remain in the substrate with a silicon carbide film 10.

The first mask 41 and the second mask 42 constituting the mask 4 can function as masks when the first SiC film 31 and the second SiC film 32 are formed by an epitaxial technique, respectively. That is, the material of the first mask 41 and the second mask 42 is not particularly limited as long as it can prevent the epitaxial growth of 3C-SiC (cubic SiC), however, for example, the first mask 41 and the second mask 42 are formed from, for example, an inorganic material such as silicon oxide ($SiO_2$) or silicon nitride (SiN).

The first mask 41 and the second mask 42 have substantially the same plan-view shape as each other. Further, when the width of the opening 45 of the first mask 41 is represented by W1 (μm), the thickness of the first mask 41 is represented by T1 (μm), and the distance from the bottom surface of the first mask 41 to the bottom surface of the second mask 42 is represented by D1 (μm), the following relationships are satisfied: $T1 < \tan(54.6°) \times W1$, and $D1 \geq \tan(54.6°) \times W1$. According to this, a substrate with a high-quality silicon carbide film 10 including a 3C-SiC film, in which the occurrence of crystal defects is reduced, can be provided. The reason for this will be described in detail in the following method for producing the substrate with a silicon carbide film 10.

Next, a method for producing the substrate with a silicon carbide film 10 (a method for producing a substrate with a silicon carbide film according to the invention) will be described.

Figure 2A:
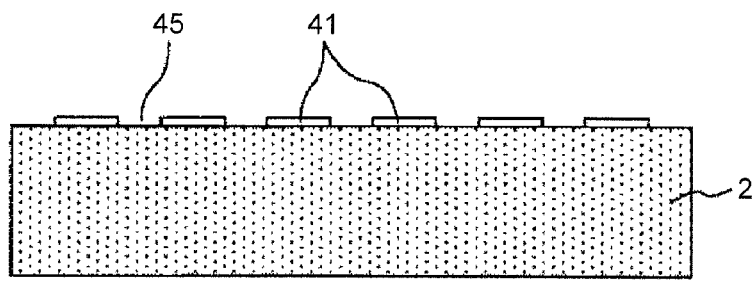
FIGS. 2A to 2D are longitudinal cross-sectional views for illustrating a method for producing the substrate with a silicon carbide film shown in FIG. 1.
Figure 2B:
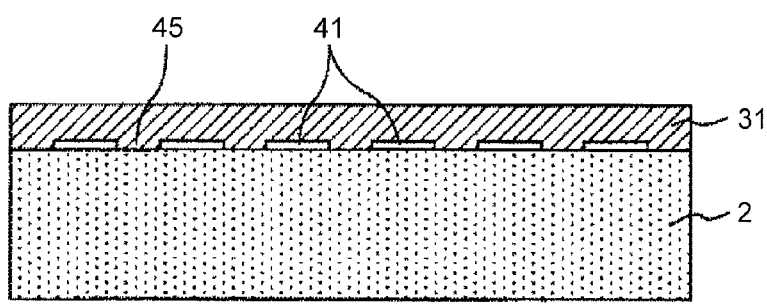
Figure 2C:
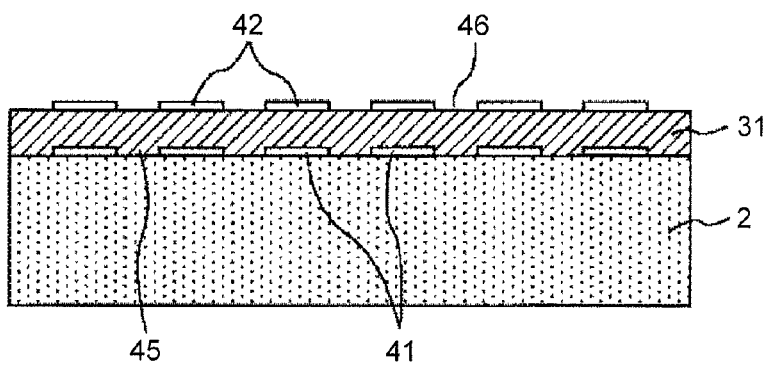
Figure 2D:
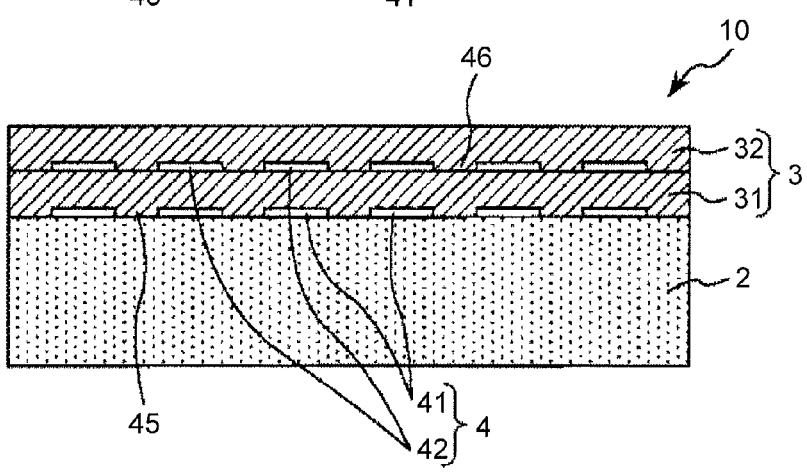
Figure 3:
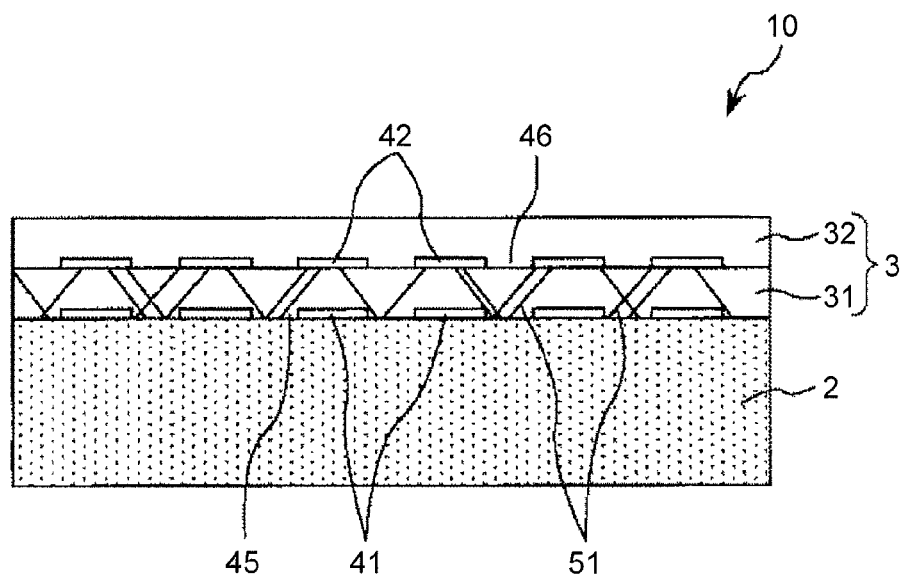
FIG. 3 is a longitudinal cross-sectional view for illustrating a method for reducing crystal defects in the substrate with a silicon carbide film shown in FIG. 1.

FIGS. 2A to 2D are longitudinal cross-sectional views for illustrating a method for producing the substrate with a silicon carbide film shown in FIG. 1, and FIG. 3 is a longitudinal cross-sectional view for illustrating a method for reducing crystal defects in the substrate with a silicon carbide film shown in FIG. 1, and all the drawings are views seen in the direction perpendicular to the (011) plane of a Si substrate. In the following description, the upper side of FIGS. 2A to 2D and 3 is referred to as "upper", and the lower side of FIGS. 2A to 2D and 3 is referred to as "lower".

The method for producing the substrate with a silicon carbide film 10 includes [1] a step of forming a first mask 41 on a Si substrate 2, [2] a step of forming a first SiC film 31 on the first mask 41 and the Si substrate 2 by using the first mask 41 as a mask, [3] a step of forming a second mask 42 on the first SiC film 31, and [4] a step of forming a second SiC film 32 on the second mask 42 and the first SiC film 31 by using the second mask 42 as a mask. Hereinafter, the respective steps will be sequentially described.

[1] First, as shown in FIG. 2A, a Si substrate 2 is prepared, and a first mask 41 including an opening 45 is formed on and in contact with the Si substrate 2.

As described above, the first mask 41 is formed from, for example, an inorganic material such as silicon oxide ($SiO_2$) or silicon nitride (SiN), however, hereinafter, a case where the first mask 41 is formed from silicon oxide will be described as an example.

Such a first mask 41 can be obtained by forming, for example, a silicon oxide film on the Si substrate 2, and thereafter patterning this silicon oxide film to form the opening 45.

As shown in FIGS. 1 and 2A to 2D, this first mask 41 has a rectangular longitudinal cross-sectional shape, and this longitudinal cross-sectional shape is substantially the same from the front side to the rear side of the paper, and patterning is performed such that when the width of the opening 45 is represented by W1 (μm), and the thickness of the first mask 41 is represented by T1 (μm), the following relationship is satisfied: $T1 < \tan(54.6°) \times W1$.

The silicon oxide film can be formed by any of various film formation methods, for example, a physical vapor deposition method (PVD method) such as a sputtering method, a chemical vapor deposition method (CVD method), a sol-gel method, or a thermal oxidation method, and above all, it is preferred to form the silicon oxide film using a thermal oxidation method or a CVD method. According to these methods, the silicon oxide film having a desired film thickness can be relatively easily formed with a uniform thickness.

1-1: Thermal Oxidation Method

The thermal oxidation method is a method for forming a silicon oxide film on the surface of the Si substrate 2 by supplying an oxygen atom-containing gas to the Si substrate 2 having been heated.

The temperature when heating (heating temperature) is preferably from about 300 to 1,200° C., more preferably from about 700 to 1,100° C.

The time when heating (heating time) may be appropriately set according to the desired thickness of the silicon oxide film and is not particularly limited, however, for example, in the case where the heating temperature is set within the above range, the heating time is preferably from about 10 to 90 minutes, more preferably from about 20 to 60 minutes.

Examples of the oxygen atom-containing gas include oxygen (pure oxygen), ozone, hydrogen peroxide, water vapor, nitrogen monoxide, nitrogen dioxide, and dinitrogen oxide, and among these, one type or two or more types in combination can be used.

1-2: CVD Method

The CVD method is a method for forming a silicon oxide film on the surface of the Si substrate 2 by introducing a silicon oxide precursor and an oxygen atom-containing gas into a chamber with a predetermined pressure, followed by heating the Si substrate 2.

Examples of the silicon oxide precursor include dichlorosilane, hexachlorodisilane, tetrakis(hydrocarbylamino)silane, and tris(hydrocarbylamino)silane, among these, one type or two or more types in combination can be used.

Examples of the oxygen atom-containing gas include oxygen (pure oxygen), ozone, hydrogen peroxide, water vapor, nitrogen monoxide, nitrogen dioxide, and dinitrogen oxide, and among these, one type or two or more types in combination can be used.

The temperature when heating (heating temperature) is preferably from about 300 to 1,000° C., more preferably from about 500 to 800° C.

The time when heating (heating time) may be appropriately set according to the desired thickness of the silicon oxide film and is not particularly limited, however, for example, in the case where the heating temperature is set within the above range, the heating time is preferably from about 10 to 90 minutes, more preferably from about 20 to 60 minutes.

The pressure (vacuum degree) in the chamber is preferably from about 0.05 mTorr to atmospheric pressure (760 Torr), more preferably from about 0.1 to 500 mTorr.

The mixing ratio (molar ratio) of the silicon oxide precursor to the oxygen atom-containing gas is preferably from about 10:1 to 1:100, more preferably from about 1:2 to 1:10.

The patterning of the silicon oxide film using a resist layer can be performed by using either wet etching or dry etching after forming a resist pattern corresponding to the shape of the opening 45 to be formed, but is preferably performed by using wet etching. By doing this, the side surface of the first mask 41 where the opening 45 is formed can be made smoother. Due to this, in the subsequent step [2], when a first SiC film 31 is formed, the occurrence of a crystal defect in the film of the first SiC film 31 starting at the side surface of the first mask 41 can be accurately reduced.

Further, in the invention, the thickness T1 of the first mask 41 is set to be relatively thin so as to satisfy the following relationship: $T < \tan(54.6°) \times W1$ as described above. Due to this, even if wet etching is used for patterning of the silicon oxide film with a resist layer, the first mask 41 having the opening 45 can be obtained by patterning the silicon oxide film with high accuracy.

Examples of this wet etching include an etching method using a hydrofluoric acid-containing solution as the etching solution.

Examples of the hydrofluoric acid-containing solution include a hydrofluoric acid (HF) solution and a buffered hydrofluoric acid (a mixed solution of hydrofluoric acid (hydrogen fluoride) and ammonium fluoride ($NH_4F$)).

[2] Subsequently, as shown in FIG. 2B, by using the first mask 41 as a mask, the first SiC film 31 is formed on the Si substrate 2 and the first mask 41.

The first SiC film 31 can be formed by introducing a starting material gas into a chamber with a predetermined pressure, heating the Si substrate 2 in this state to epitaxially grow cubic silicon carbide (3C-SiC) on the Si substrate 2 exposed in the opening 45.

By the epitaxial growth, cubic silicon carbide (3C-SiC) is formed starting at the Si substrate 2 exposed in the opening 45 so as to cover the Si substrate 2, and thereafter, accompanying further growth of 3C-SiC, 3C-SiC covers not only the Si substrate 2, but also the first mask 41, and as a result, the first SiC film 31 which covers the entire surface of the Si substrate 2 and the first mask 41 as shown in FIG. 2B is formed.

As shown in FIGS. 1 and 2A to 2D, this first SiC film 31 is formed such that the thickness thereof at a position where the first mask 41 is not present satisfies the relationship of $\tan(54.6°) \times W1$ or more.

Examples of the starting material gas include a mixed gas in which a carbon-containing gas and a silicon-containing gas are mixed at a predetermined ratio, a carbon and silicon-containing gas in which carbon and silicon are contained at a predetermined ratio, and a mixed gas of multiple gases in which a carbon-containing gas, a silicon-containing gas, and a carbon and silicon-containing gas are mixed at a predetermined ratio, and any of these gases is introduced into a chamber as the starting material gas.

Examples of the carbon-containing gas include, in addition to ethylene ($C_2H_4$), acetylene ($CH_2$), propane ($C_3H_8$), methane ($CH_4$), ethane ($C_2H_6$), normal butane (n-$C_4H_{10}$), isobutane (i-$C_4H_{10}$), and neopentane (neo-$C_5H_{12}$), and among these, one type or two or more types in combination can be used.

Examples of the silicon-containing gas include monosilane ($SiH_4$), disilane ($Si_2H_6$), trisilane ($Si_3H_8$), tetrasilane ($Si_4H_{10}$), dichlorosilane ($SiH_2Cl_2$), tetrachlorosilane ($SiCl_4$), trichlorosilane ($SiHCl_3$), and hexachlorodisilane ($Si_2Cl_6$), and among these, one type or two or more types in combination can be used.

Examples of the carbon and silicon-containing gas include methylsilane ($SiH_3CH_3$), dimethylsilane ($SiH_2(CH_3)_2$), and trimethylsilan ($SiH(CH_3)_3$), and among these, one type or two or more types in combination can be used.

By performing epitaxial growth using any of these gasses, the first SiC film 31 composed of cubic silicon carbide is formed according to the stoichiometric composition.

The temperature when heating (heating temperature), that is, the temperature of the Si substrate 2 when performing epitaxial growth is preferably 600° C. or higher and 1,400° C. or lower, more preferably 800° C. or higher and 1,350° C. or lower.

The time when heating (heating time) is appropriately set according to the desired thickness of the first SiC film 31.

The pressure (vacuum degree) in the chamber is preferably $7.5 \times 10^{-7}$ Torr or more and atmospheric pressure (760 Torr) or less, more preferably $7.5 \times 10^{-6}$ Torr or more and 0.5 Torr or less.

On the upper surface of the first SiC film 31, irregularities derived from the shape of the first mask 41 may sometimes be formed. In such a case, it is preferred to smooth the surface by a CMP method (chemical mechanical polishing method), a dry etching method, or the like.

[3] Subsequently, as shown in FIG. 2C, a second mask 42 including an opening 46 is formed on the first SiC film 31.

The second mask 42 can be obtained by, for example, forming a silicon oxide ($SiO_2$) film in the form of a layer on the first SiC film 31, and then patterning the silicon oxide film, thereby forming an opening 46.

In this embodiment, the second mask 42 has substantially the same plan-view shape as the first mask 41. That is, the second mask 42 has a line and space pattern with the same size as the first mask 41. Then, the second mask 42 is placed at a position where it overlaps the first mask 41 in plan view.

Further, the second mask 42 is formed such that the thickness of the first SiC film 31 at a position where the first mask 41 is not present satisfies the relationship of $\tan(54.6°) \times W1$ or more in the above-mentioned step [2], and therefore, when the distance from the bottom surface of the first mask 41 to the bottom surface of the second mask 42 is represented by D1 (μm), the following relationship is satisfied: $D1 \geq \tan(54.6°) \times W1$.

The silicon oxide film can be formed using the same method as described in the above-mentioned step [1], however, above all, it is preferably formed using a CVD method. By using a CVD method, the silicon oxide film having a desired film thickness can be relatively easily formed with a uniform film thickness on the first SiC film 31.

The patterning of the silicon oxide film can be performed using the same method as described in the above-mentioned step [1].

[4] Subsequently, as shown in FIG. 2D, a second SiC film 32 is formed on the first SiC film 31 and the second mask 42 by using the second mask 42 as a mask.

The second SiC film 32 can be formed by introducing a starting material gas into a chamber with a predetermined pressure, and heating the Si substrate 2 in this state in the same manner as the first SiC film 31 described in the above-mentioned step [2]. That is, the second SiC film 32 can be formed by epitaxially growing cubic silicon carbide (3C-SiC) on the first SiC film 31 exposed in the opening 46.

By the epitaxial growth, cubic silicon carbide (3C-SiC) is formed starting at the first SiC film 31 exposed in the opening 46, thereby covering the first SiC film 31, and thereafter, accompanying further growth of 3C-SiC, 3C-SiC covers not only the first SiC film 31, but also the second mask 42, and as a result, the second SiC film 32 which covers the entire surface of the first SiC film 31 and the second mask 42 as shown in FIG. 2D is formed.

Here, in the process of epitaxial growth on the Si substrate 2 exposed in the opening 45 using the first mask 41 in the above-mentioned step [2], in the first SiC film 31 to be formed, many crystal defects 51 occur due to a difference in the lattice constant from the Si substrate 2.

It is known that when the upper surface of the Si substrate 2 has a plane orientation of (100), these crystal defects 51 grow along the plane orientation of (111) in the first SiC film 31 to be formed as shown in FIG. 3.

Further, in this embodiment, as described above, the first mask 41 and the second mask 42 have substantially the same plan-view shape as each other, and are placed at positions where they overlap each other in plan view, and further the first mask 41 satisfies the following relationship: $T1 < \tan(54.6°) \times W1$, whereby the second mask 42 is formed at a position where the following relationship is satisfied: $D1 \geq \tan(54.6°) \times W1$.

Therefore, the crystal defect 51 occurring on the Si substrate 2 exposed in the opening 45 grows along the plane orientation of (111) in the first SiC film 31. Due to this, on the upper surface of the first SiC film 31, the crystal defect is covered by the bottom surface of the second mask 42 formed at a position satisfying the following relationship: $D1 \geq \tan(54.6°) \times W1$, and as a result, the crystal defect 51 is terminated by the bottom surface of the second mask 42.

Accordingly, on the first SiC film 31 exposed in the opening 46 of the second mask 42, the occurrence of the crystal defect 51 is accurately suppressed or prevented.

Therefore, in the second SiC film 32 formed starting at the upper surface of the first SiC film 31 exposed in the opening 46 of the second mask 42, the occurrence of the crystal defect 51 is accurately suppressed or prevented, and therefore, a 3C-SiC (cubic silicon carbide) film 3 composed of the first SiC film 31 and the second SiC film 32 can be formed as a high-quality film with few crystal defects. Further, since the crystal defects are few, the occurrence of stress in the SiC film 3 can be accurately suppressed.

The specific sizes of the first mask 41 and the second mask 42 satisfying the relationship as described above, and also the first SiC film 31 can be set as follows, respectively.

The thickness T1 of the first mask 41 and the thickness T2 of the second mask 42 are independently set to preferably 0.01 μm or more and 1.0 μm or less, more preferably 0.05 μm or more and 0.5 μm or less.

The width W2 of each of the first mask 41 and the second mask 42 is independently set to preferably 0.2 μm or more and 10.0 μm or less, more preferably 0.5 μm or more and 5.0 μm or less. Further, the width W1 of each of the openings 45 and

46 is independently set to preferably 0.2 μm or more and 10.0 μm or less, more preferably 0.5 μm or more and 5.0 μm or less.

Further, the distance D1 from the bottom surface of the first mask 41 to the bottom surface of the second mask 42, that is, the thickness of the first SiC film 31 at a position where the first mask 41 is not present is preferably set to 0.28 μm or more and 14.0 μm or less, more preferably 0.7 μm or more and 7.0 μm or less.

In the substrate with a silicon carbide film 10 having such a size, by satisfying the above-mentioned relationships, the occurrence of the crystal defect 51 in the second SiC film 32 can be more accurately suppressed or prevented.

As described above, the substrate with a silicon carbide film 10 shown in FIG. 1 is obtained.

In this embodiment, a case where one layer each of the second mask 42 and the second SiC film 32 are stacked on the first SiC film 31 has been described, however, the invention is not limited to this case, and two or more layers of the second masks 42 and the second SiC films 32 may be further stacked in this order. That is, the substrate with a silicon carbide film 10 may be a substrate obtained by stacking 2, 3, . . . or n layers of the second masks 42 and the second SiC films 32 on the first SiC film 31.

Further, in this embodiment, a case where the first mask 41 is formed on and in contact with the Si substrate 2 has been described, however, the invention is not limited to this configuration, and for example, the SiC film 3 may be configured to further include a fourth film, and the fourth film is formed on the Si substrate 2 so as to cover the entire surface of the Si substrate 2, and the first mask 41 may be formed on and in contact with the fourth film (SiC film). In this manner, by adopting a configuration in which the fourth film which covers the entire surface of the Si substrate 2 is formed, an effect that a uniform first SiC film 31 can be more stably formed as compared with the case where the first SiC film 31 is formed on and in contact with the Si substrate (silicon substrate) 2 is obtained.

The substrate with a silicon carbide film 10 including such a fourth film can be obtained by, for example, forming the fourth film on the Si substrate 2 using the method described in the above-mentioned step [2] prior to the above-mentioned step [1], and then forming the first mask 41 on the fourth film by the above-mentioned step [1], followed by performing the same steps as the above-mentioned steps [2] to [4].

Second Embodiment

Next, a second embodiment of the substrate with a silicon carbide film according to the invention will be described.

Figure 4:
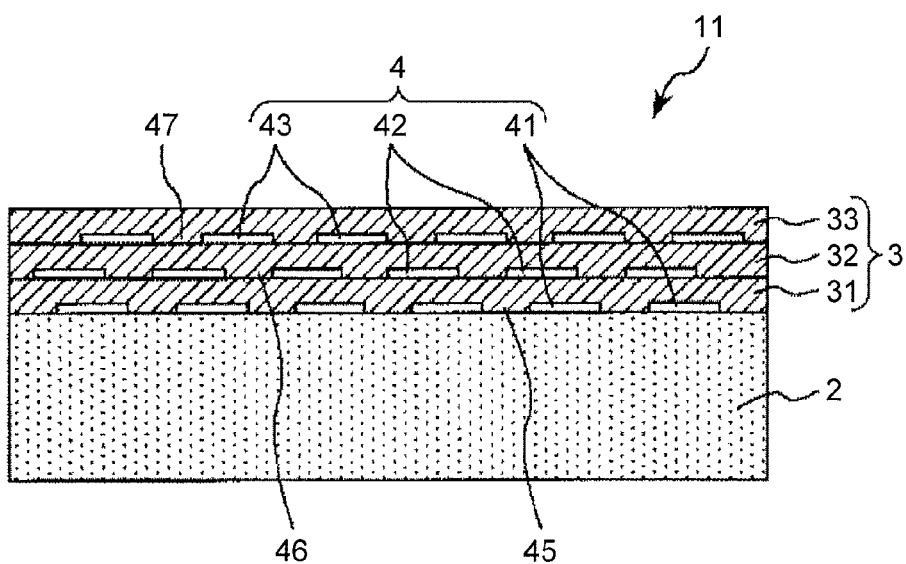
FIG. 4 is a longitudinal cross-sectional view showing a second embodiment of a substrate with a silicon carbide film according to the invention.

FIG. 4 is a longitudinal cross-sectional view showing a second embodiment of a substrate with a silicon carbide film according to the invention, and is a view seen from the direction perpendicular to the (011) plane of a Si substrate. In the following description, the upper side of FIG. 4 is referred to as "upper", and the lower side of FIG. 4 is referred to as "lower".

Hereinafter, with respect to a substrate with a silicon carbide film 11 according to the second embodiment, different points from the above-mentioned substrate with a silicon carbide film 10 according to the first embodiment will be mainly described, and a description of the same matter will be omitted.

In the substrate with a silicon carbide film 11 shown in FIG. 4, a SiC film 3 further has a third SiC film 33 provided on the upper side of a second SiC film 32, and a mask 4 further has a third mask 43 provided on the second SiC film 32 and including an opening (third opening) 47. Then, the second mask 42 is not placed at a position where it overlaps the first mask 41 in plan view, and further the following relationship is not satisfied: D1≥tan(54.6°)×W1, and the film thickness of the first SiC film 31 is set to be thin so as to satisfy the following relationship: D1<tan(54.6°)×W1. The configuration other than these is the same as that of the substrate with a silicon carbide film 10 shown in FIG. 1.

Here, the second mask 42 is not placed at a position where it overlaps the first mask 41 in plan view, and further, the film thickness of the first SiC film 31 is set to be thin so as to satisfy the following relationship: D1<tan(54.6°)×W1, and therefore, in the first SiC film 31, part of crystal defects 51 growing along the plane orientation of (111) are exposed from an opening 46 without being terminated by the bottom surface of the second mask 42 on the upper surface of the first SiC film 31.

Therefore, part of the crystal defects 51 remain also in the second SiC film 32 formed starting at the upper surface of the first SiC film 31 exposed in the opening 46 of the second mask 42. However, in this embodiment, the third mask 43 and the third SiC film 33 having the same configuration as the relationship of the second mask 42 and the second SiC film 32 to the first SiC film 31 are formed on the second SiC film 32. Due to this, the part of the crystal defects 51 remaining in the second SiC film 32 can be terminated by the bottom surface of the third mask 43 on the upper surface of the second SiC film 32.

Accordingly, in the third SiC film 33 formed starting at the upper surface of the second SiC film 32 exposed in the opening 47 of the third mask 43, the occurrence of the crystal defect 51 can be accurately suppressed or prevented. As a result, the 3C-SiC (cubic silicon carbide) film 3 composed of the first SiC film 31, the second SiC film 32, and the third SiC film 33 can be formed as a high-quality film with few crystal defects. Further, since the crystal defects are few, the occurrence of stress in the SiC film 3 can be accurately suppressed.

In the above-mentioned manner, also by the substrate with a silicon carbide film 11 according to the second embodiment, the same effect as in the above-mentioned first embodiment is obtained.

Such a substrate with a silicon carbide film 11 according to the second embodiment can be produced as described below.

FIGS. 5A to 5D, and 6A and 6B are longitudinal cross-sectional views for illustrating a method for producing the substrate with a silicon carbide film shown in FIG. 4, and all the drawings are views seen in the direction perpendicular to the (011) plane of a Si substrate. In the following description, the upper side of FIGS. 5A to 5D, and 6A and 6B is referred to as "upper", and the lower side of FIGS. 5A to 5D, and 6A and 6B is referred to as "lower".

The method for producing the substrate with a silicon carbide film 11 according to this embodiment includes [1B] a step of forming a first mask 41 on a Si substrate 2, [2B] a step of forming a first SiC film 31 on the first mask 41 and the Si substrate 2 by using the first mask 41 as a mask, [3B] a step of forming a second mask 42 on the first SiC film 31, [4B] a step of forming a second SiC film 32 on the second mask 42 and the first SiC film 31 by using the second mask 42 as a mask, [5B] a step of forming a third mask 43 on the second SiC film 32, and [6B] a step of forming a third SiC film 33 on the third mask 43 and the second SiC film 32 by using the third mask 43 as a mask. Hereinafter, the respective steps will be sequentially described.

Figure 5A:
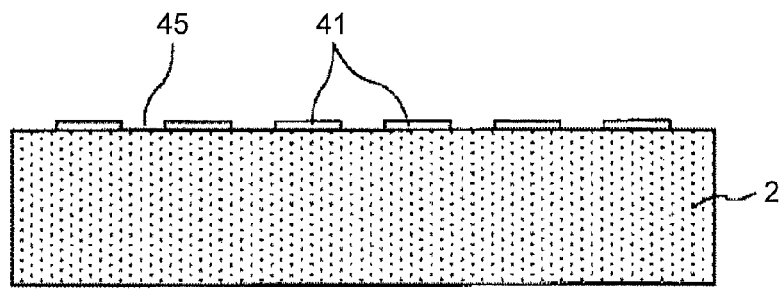
FIGS. 5A to 5D are longitudinal cross-sectional views for illustrating a method for producing the substrate with a silicon carbide film shown in FIG. 4.

[1B] First, as shown in FIG. 5A, in the same manner as in the above-mentioned step [1], a Si substrate 2 is prepared, and a first mask 41 including an opening 45 and satisfying the following relationship: T1<tan(54.6°)×W1 is formed on the Si substrate 2.

Figure 5B:
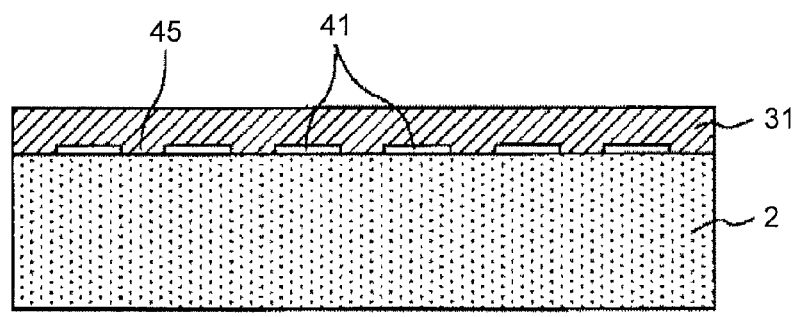

[2B] Subsequently, as shown in FIG. 5B, in the same manner as in the above-mentioned step [2], by using the first mask 41 as a mask, a first SiC film 31 is formed on the Si substrate 2 and the first mask 41.

In this embodiment, as shown in FIGS. 4 and 5A to 5D, this first SiC film 31 is formed thin such that the thickness thereof at a position where the first mask 41 is not present satisfies the relationship of less than $\tan(54.6°) \times W1$ without satisfying the relationship of $\tan(54.6°) \times W1$ or more.

Figure 5C:
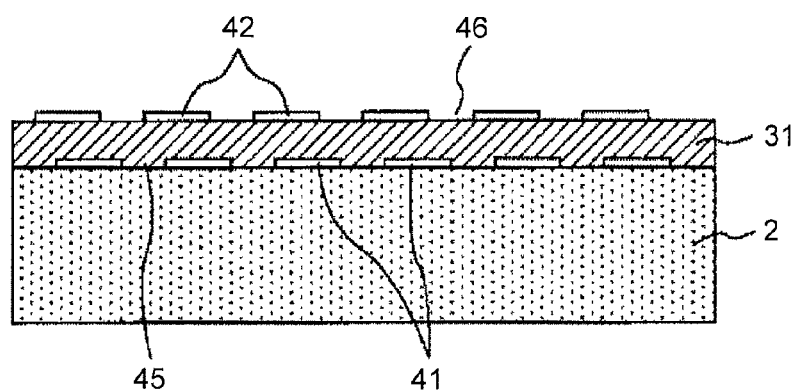

[3B] Subsequently, as shown in FIG. 5C, in the same manner as in the above-mentioned step [3], a second mask 42 including an opening 46 is formed on the first SiC film 31.

This second mask 42 has substantially the same plan-view shape as the first mask 41 in the same manner as in the first embodiment. That is, the second mask 42 has a line and space pattern with the same size as the first mask 41. However, in this embodiment, the second mask 42 is placed at a position where it does not overlap at full the first mask 41 in plan view.

Further, the second mask 42 is formed such that the thickness of the first SiC film 31 at a position where the first mask 41 is not present satisfies the relationship of less than $\tan(54.6°) \times W1$ in the above-mentioned step [2B], and therefore, when the distance from the bottom surface of the first mask 41 to the bottom surface of the second mask 42 is represented by D1 (μm), the following relationship is satisfied: $D1 < \tan(54.6°) \times W1$.

Figure 5D:
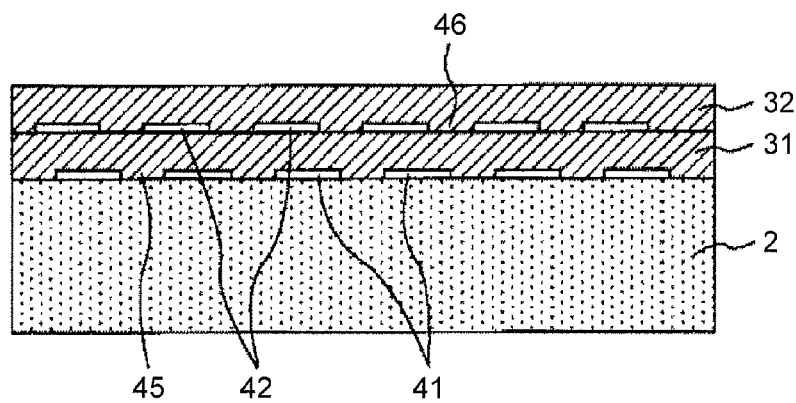

[4B] Subsequently, as shown in FIG. 5D, in the same manner as in the above-mentioned step [4], a second SiC film 32 is formed on the first SiC film 31 and the second mask 42 by using the second mask 42 as a mask.

In this embodiment, as shown in FIGS. 4 and 5A to 5D, this second SiC film 32 is formed thin such that the thickness thereof at a position where the second mask 42 is not present satisfies the relationship of less than $\tan(54.6°) \times W1$ in the same manner as the first SiC film 31.

Figure 6A:
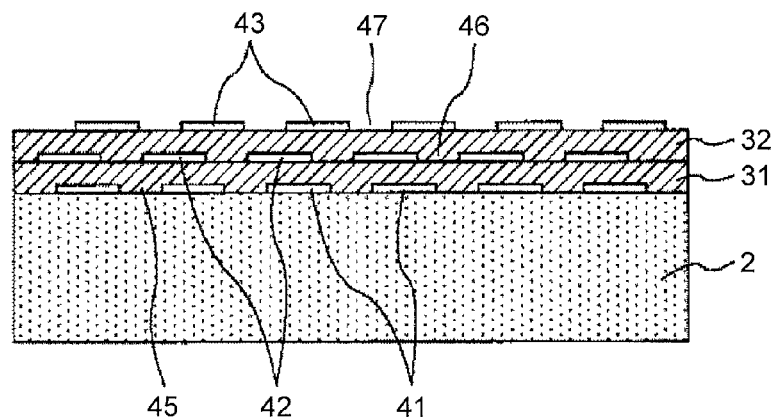
FIGS. 6A and 6B are longitudinal cross-sectional views for illustrating a method for producing the substrate with a silicon carbide film shown in FIG. 4.

[5B] Subsequently, as shown in FIG. 6A, in the same manner as in the above-mentioned step [3], a third mask 43 including an opening 47 is formed on the second SiC film 32.

This third mask 43 has substantially the same plan-view shape as the first mask 41 in the same manner as in the first embodiment. That is, the third mask 43 has a line and space pattern with the same size as the first mask 41. However, in this embodiment, the third mask 43 is placed at a position where it does not overlap at full the first mask 41 and the second mask 42 in plan view.

Further, the third mask 43 is formed such that the thickness of the second SiC film 32 at a position where the second mask 42 is not present satisfies the relationship of less than $\tan(54.6°) \times W1$ in the above-mentioned step [4B], and therefore, when the distance from the bottom surface of the second mask 42 to the bottom surface of the third mask 43 is represented by D1 (μm), the following relationship is satisfied: $D1 < \tan(54.6°) \times W1$.

Figure 6B:
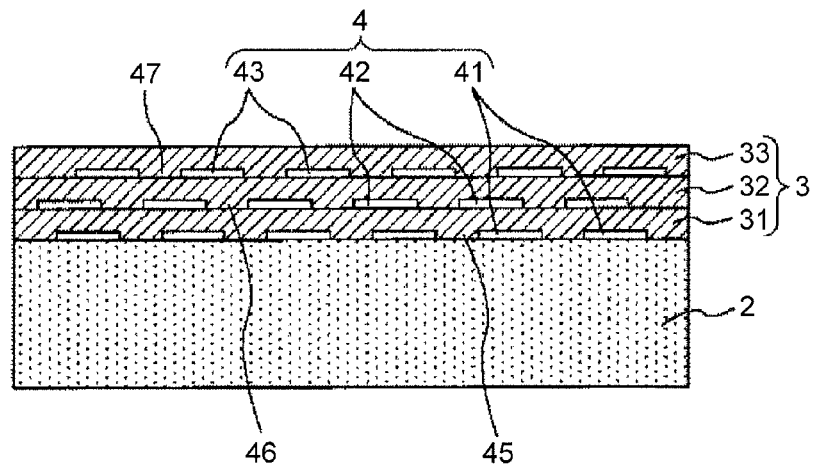

[6B] Subsequently, as shown in FIG. 6B, in the same manner as in the above-mentioned step [4], a third SiC film 33 is formed on the second SiC film 32 and the third mask 43 by using the third mask 43 as a mask.

At this time, as described above, in the third SiC film 33 formed starting at the upper surface of the second SiC film 32 exposed in the opening 47 of the third mask 43, the occurrence of the crystal defect 51 can be accurately suppressed or prevented. As a result, the 3C-SiC (cubic silicon carbide) film 3 composed of the first SiC film 31, the second SiC film 32, and the third SiC film 33 can be formed as a high-quality film with few crystal defects. Further, since the crystal defects are few, the occurrence of stress in the SiC film 3 can be accurately suppressed.

In the above-mentioned manner, the substrate with a silicon carbide film 11 shown in FIG. 4 is obtained.

In this embodiment, a case where one layer each of the second mask 42, the second SiC film 32, the third mask 43, and the third SiC film 33 are stacked in this order on the first SiC film 31 has been described, however, the invention is not limited to this case, and two or more layers of the second masks 42, the second SiC films 32, the third masks 43, and the third SiC films 33 may be further stacked in this order. That is, the substrate with a silicon carbide film 11 may be a substrate obtained by stacking 2, 3, . . . or n layers of the second masks 42, the second SiC films 32, the third masks 43, and the third SiC films 33 on the first SiC film 31.

Third Embodiment

Figure 7:
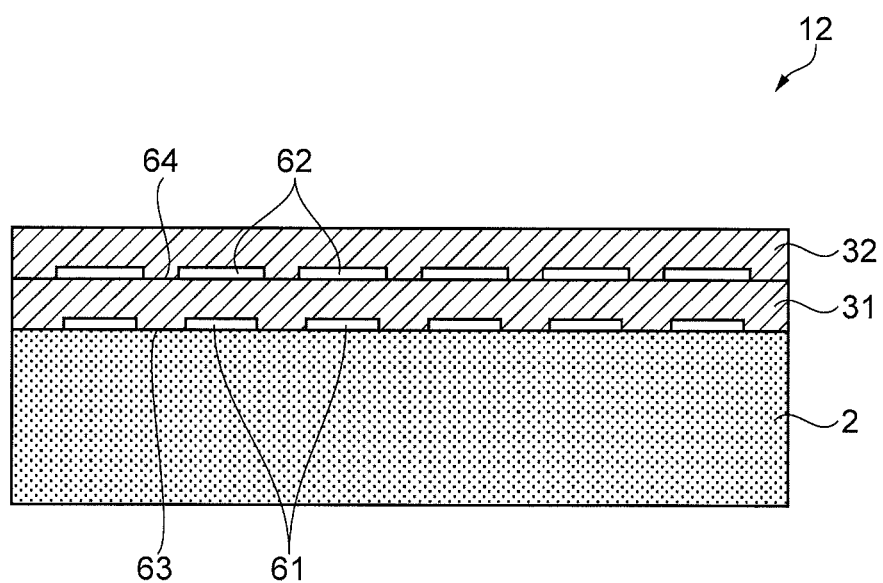
FIG. 7 is a longitudinal cross-sectional view showing a third embodiment of a substrate with a silicon carbide film according to the invention.

A substrate with a silicon carbide film 12 according to this embodiment is shown in FIG. 7. The substrate with a silicon carbide film 12 has a first mask 61 formed on a silicon substrate 2 and a second mask 62 formed on a first SiC film 31. The width of an opening 64 of the second mask 62 is smaller than the width of an opening 63 of the first mask 61. By setting the width of the opening 64 to be smaller, in a second SiC film 32, the risk of crystal defects which occur starting at the opening by epitaxial growth is tried to be reduced, and thus, a film having fewer crystal defects can be formed.

The substrate with a silicon carbide film according to any of the above-mentioned embodiments includes a high-quality SiC film (cubic silicon carbide film) 3 with extremely few crystal defects, and therefore is favorably used as a silicon carbide (SiC) semiconductor expected as a wide band gap semiconductor. Due to this, the substrate with a silicon carbide film can be favorably used in a semiconductor device including a silicon carbide (SiC) semiconductor, and the semiconductor device can be made to have a high withstand voltage.

Examples of this semiconductor device include a metal-oxide-semiconductor field-effect transistor (MOSFET), an insulated-gate bipolar transistor (IGBT), and a Schottky barrier diode (SBD).

Hereinabove, the substrate with a silicon carbide film, the method for producing a substrate with a silicon carbide film, and the semiconductor device according to the invention have been described based on the embodiments shown in the drawings, however, the invention is not limited thereto.

For example, in the method for producing a substrate with a silicon carbide film according to the invention, an arbitrary step can be added as needed.

Further, the configuration of each part in the substrate with a silicon carbide film and the semiconductor device according to the invention can be replaced with an arbitrary configuration having a similar function, and also an arbitrary configuration can be added.

What is claimed is:
1. A substrate with a silicon carbide film, comprising:
a silicon substrate; and
a cubic silicon carbide film and a mask stacked on the silicon substrate, wherein
the cubic silicon carbide film has a first cubic silicon carbide film provided on the upper side of the silicon substrate and a second cubic silicon carbide film provided on the upper side of the first cubic silicon carbide film,
the mask has a first mask provided between the silicon substrate and the first cubic silicon carbide film and a second mask provided between the first cubic silicon carbide film and the second cubic silicon carbide film, the first mask includes a first opening, and the silicon substrate is exposed from the first opening, the second mask includes a second opening, and the first cubic silicon carbide film is exposed from the second opening, and when the width of the first opening is represented by W1 (μm) and the thickness of the first mask is represented by T1 (μm), the following relationship is satisfied: $T1 < \tan(54.6°) \times W1$.

2. The substrate with a silicon carbide film according to claim 1, wherein the first mask and the second mask are placed at positions where they overlap each other in plan view.

3. The substrate with a silicon carbide film according to claim 1, wherein the width of the second opening is the same as or smaller than the width of the first opening.

4. The substrate with a silicon carbide film according to claim 1, wherein when the distance from the bottom surface of the first mask to the bottom surface of the second mask is represented by D1 (μm), the following relationship is satisfied: $D1 \geq \tan(54.6°) \times W1$.

5. The substrate with a silicon carbide film according to claim 1, wherein the surface of the silicon substrate on which the first cubic silicon carbide film is formed has a plane orientation of (100).

6. The substrate with a silicon carbide film according to claim 1, wherein the cubic silicon carbide film further has a third cubic silicon carbide film provided on the upper side of the second cubic silicon carbide film, and the mask further has a third mask provided between the second cubic silicon carbide film and the third cubic silicon carbide film, and the third mask includes a third opening, and the second cubic silicon carbide film is exposed from the third opening.

7. The substrate with a silicon carbide film according to claim 1, wherein the first mask is provided on and in contact with the silicon substrate.

8. A method for producing a substrate with a silicon carbide film, comprising:

a first step of forming a first film on a silicon substrate;

a second step of forming a first opening for exposing the silicon substrate in the first film;

a third step of forming a first cubic silicon carbide film to a predetermined thickness on the silicon substrate exposed in the first opening by epitaxial growth;

a fourth step of forming a second film on the first cubic silicon carbide film;

a fifth step of forming a second opening for exposing the first cubic silicon carbide film in the second film; and a sixth step of forming a second cubic silicon carbide film on the first cubic silicon carbide film exposed in the second opening by epitaxial growth, wherein when the thickness of the first film is represented by T1 and the width of the first opening is represented by W1, the following relationship is satisfied: $T1 < \tan(54.6°) \times W1$.

9. The method for producing a substrate with a silicon carbide film according to claim 8, wherein in the third step, when the predetermined thickness is represented by D1, the following relationship is satisfied: $D1 \geq \tan(54.6°) \times W1$.

10. The method for producing a substrate with a silicon carbide film according to claim 8, wherein the upper surface of the silicon substrate has a plane orientation of (100).

11. The method for producing a substrate with a silicon carbide film according to claim 8, wherein the width of the second opening is the same as or smaller than the width of the first opening, and the first opening and the second opening are placed at positions where they overlap each other when the silicon substrate is seen in plan view.

12. The method for producing a substrate with a silicon carbide film according to claim 8, wherein the method further comprises:

a seventh step of forming a third film on the second cubic silicon carbide film;

an eighth step of forming a third opening for exposing the second cubic silicon carbide film in the third film; and a ninth step of forming a third cubic silicon carbide film on the second cubic silicon carbide film exposed from the third opening by epitaxial growth.

13. A semiconductor device, wherein the semiconductor device is produced by using the substrate with a silicon carbide film according to claim 1.

14. A semiconductor device, wherein the semiconductor device is produced by using the substrate with a silicon carbide film according to claim 2.

15. A semiconductor device, wherein the semiconductor device is produced by using the substrate with a silicon carbide film according to claim 3.

16. A semiconductor device, wherein the semiconductor device is produced by using the substrate with a silicon carbide film according to claim 4.

17. A semiconductor device, wherein the semiconductor device is produced by using the substrate with a silicon carbide film according to claim 5.

18. A semiconductor device, wherein the semiconductor device is produced by using the substrate with a silicon carbide film according to claim 6.

19. A semiconductor device, wherein the semiconductor device is produced by using the substrate with a silicon carbide film according to claim 7.

* * * * *